(12) United States Patent
Liu

(10) Patent No.: US 12,283,588 B2
(45) Date of Patent: Apr. 22, 2025

(54) METHODS RELATED TO FORMING SEMICONDUCTOR DEVICES

(71) Applicant: TAIWAN SEMICONDUCTOR MANUFACTURING COMPANY LTD., Hsinchu (TW)

(72) Inventor: Jack Liu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 189 days.

(21) Appl. No.: 18/053,766

(22) Filed: Nov. 9, 2022

(65) Prior Publication Data

US 2023/0067635 A1    Mar. 2, 2023

Related U.S. Application Data

(62) Division of application No. 16/883,610, filed on May 26, 2020, now Pat. No. 11,508,714.

(60) Provisional application No. 62/964,291, filed on Jan. 22, 2020.

(51) Int. Cl.
| | |
|---|---|
| *H01L 23/52* | (2006.01) |
| *H01L 23/498* | (2006.01) |
| *H01L 23/528* | (2006.01) |
| *H01L 27/02* | (2006.01) |
| *G06F 30/392* | (2020.01) |

(52) U.S. Cl.
CPC ...... *H01L 27/0207* (2013.01); *H01L 23/5286* (2013.01); *G06F 30/392* (2020.01)

(58) Field of Classification Search
CPC ... G06F 30/30; G06F 30/398; H01L 27/0207; H01L 23/528; H01L 2027/11875
See application file for complete search history.

(56) References Cited

U.S. PATENT DOCUMENTS

| | | | |
|---|---|---|---|
| 10,769,342 B2* | 9/2020 | Sio | ............ G03F 1/36 |
| 11,222,157 B2* | 1/2022 | Sio | ......... G06F 30/392 |
| 2009/0300569 A1* | 12/2009 | Frenkil | ............ H01L 27/0207 |
| | | | 716/122 |
| 2019/0267316 A1* | 8/2019 | Nelson | ............ H01L 23/5286 |
| 2020/0042668 A1* | 2/2020 | Peng | ............ H01L 23/535 |

* cited by examiner

*Primary Examiner* — Kyoung Lee
*Assistant Examiner* — David J Goodwin
(74) *Attorney, Agent, or Firm* — WPAT LAW; Anthony King

(57) ABSTRACT

A method includes: providing a cell of a first group that supplies a first potential from a backside of a substrate, multiple cells of a second group, and two cells of a third group that supply a second potential from the backside; determining a distance in a row direction between the cell of the first group and each of the two cells of the third group; determining a placement of the cell of the first group, the two cells of the third group, and each of the cells of the second group; and counting a number of pins of the cells of the second group. The cell of the first group is located between the two cells of the third group. Each of the cells of the second group is located between the two cells of the third group.

20 Claims, 13 Drawing Sheets

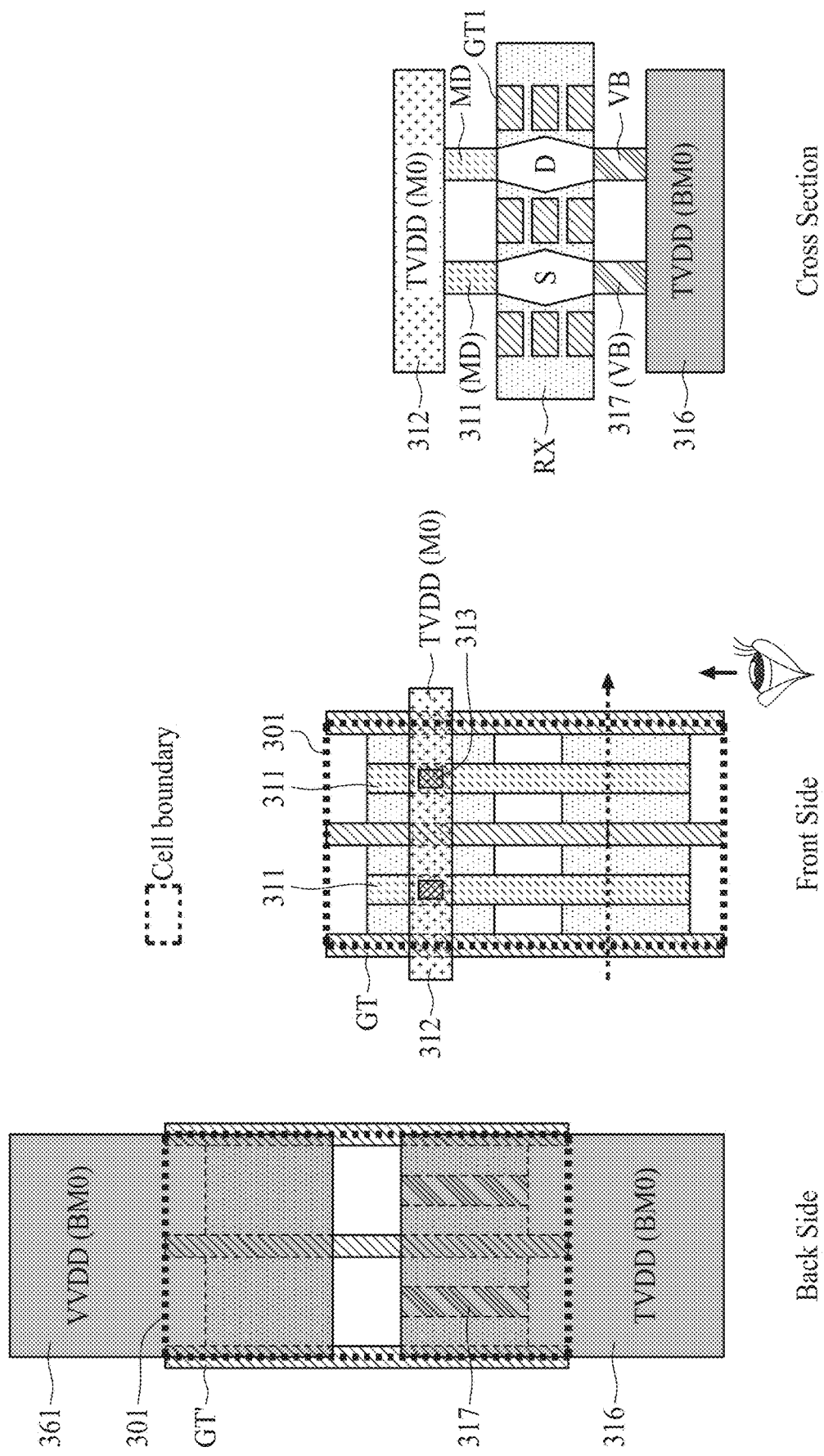

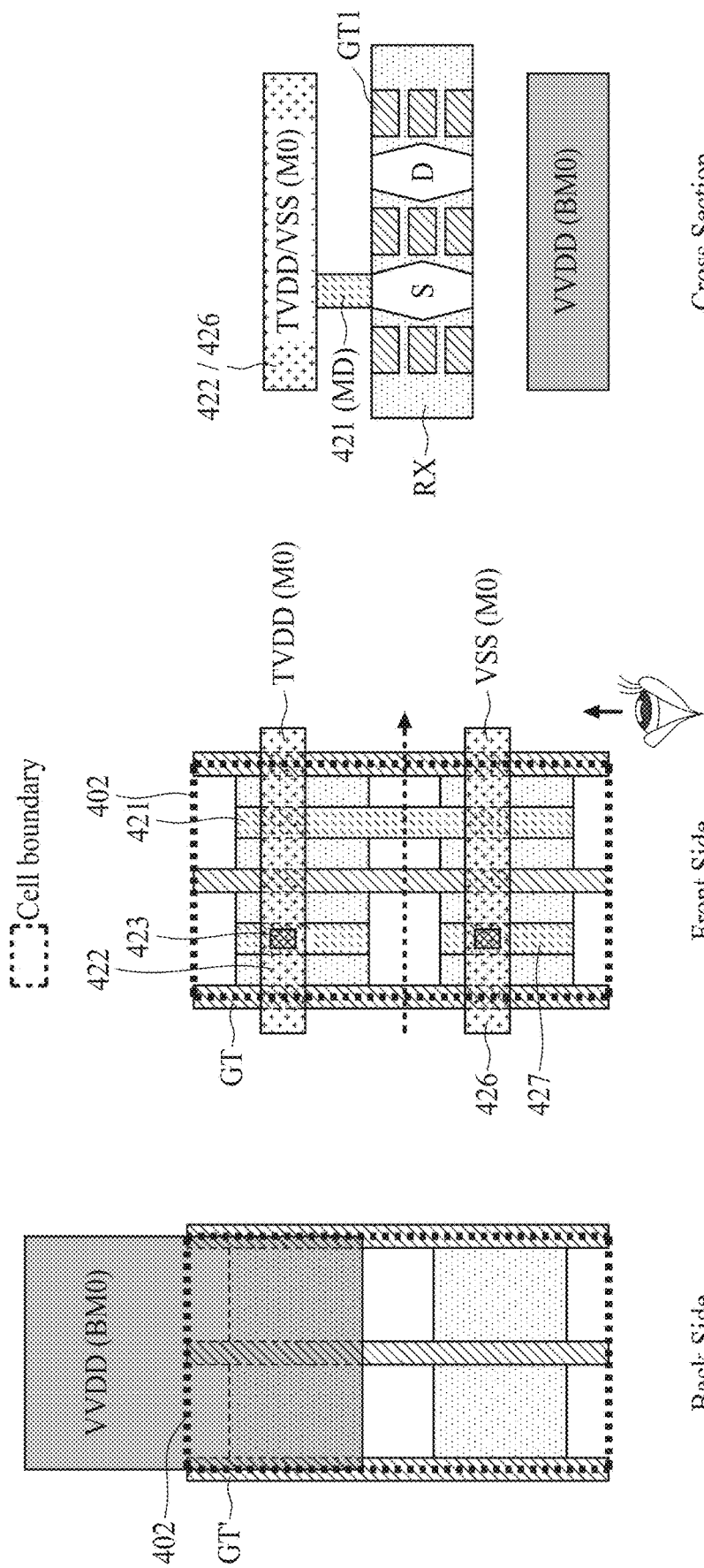

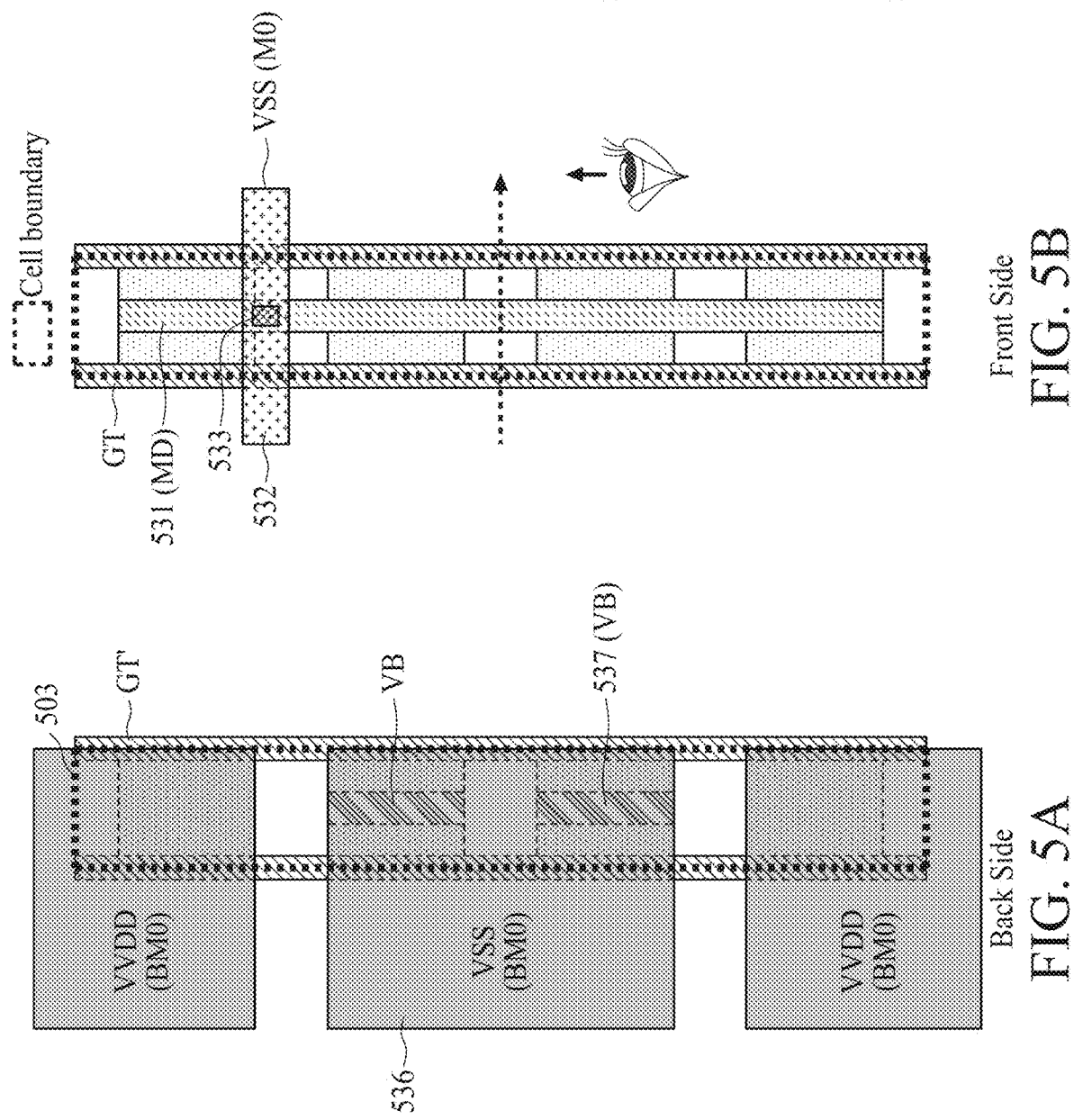

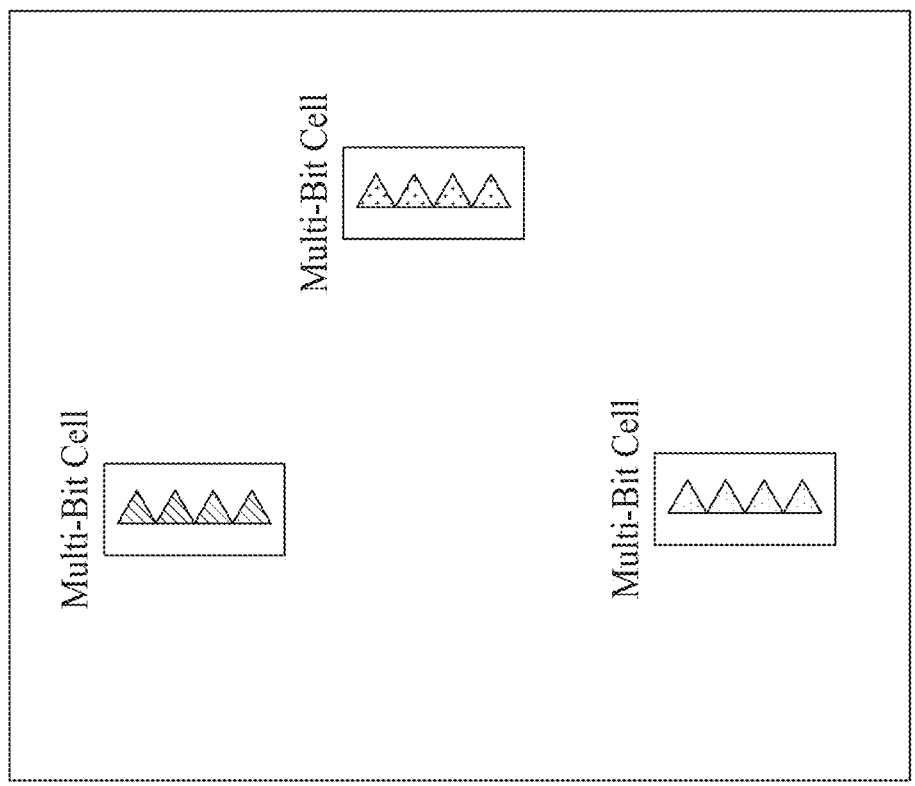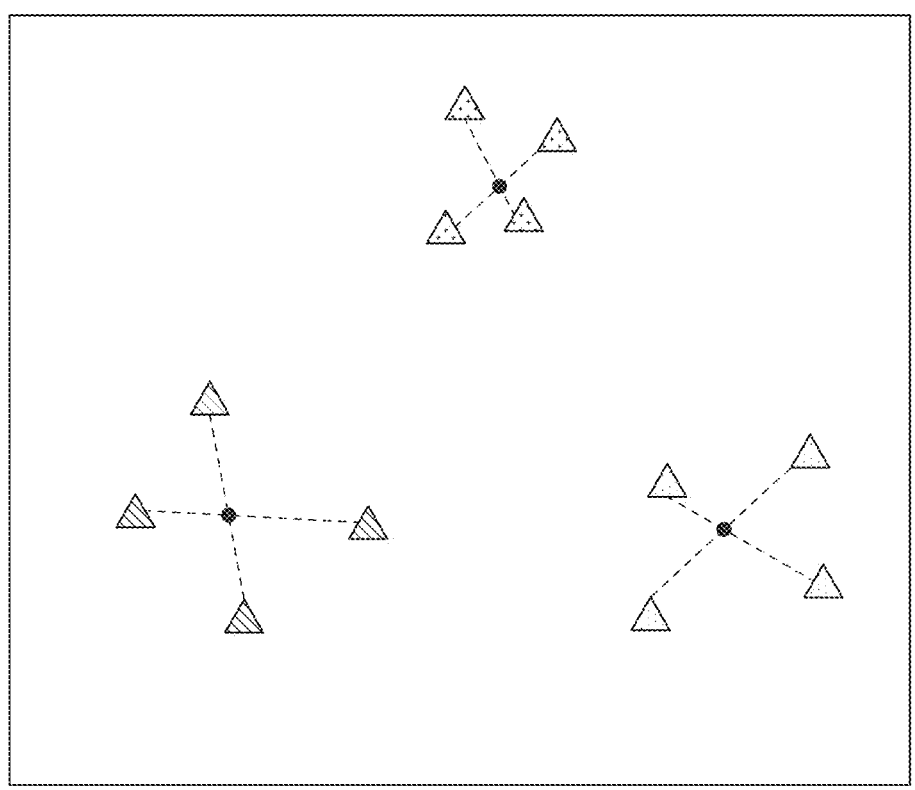
FIG. 8

METHODS RELATED TO FORMING SEMICONDUCTOR DEVICES

PRIORITY CLAIM AND CROSS-REFERENCE

This application is a divisional application of U.S. patent application Ser. No. 16/883,610, filed on 26 May 2020, which was issued on Nov. 22, 2022 as U.S. Pat. No. 11,508,714 and claims priority to U.S. Provisional Application No. 62/964,291, filed on Jan. 22, 2020, which applications are hereby incorporated herein by reference.

BACKGROUND

Today, semiconductor devices and integrated circuits are designed by placing various standard or custom cells with different functions. For example, the designers, or EDA (Electronic Design Automation) or ECAD (Electronic Computer-Aided Design) tools may draw design layouts of the integrated circuits including the s standard or custom cells. The design layouts are converted to photomasks. Then, semiconductor integrated circuits can be manufactured, when patterns of various layers, defined by photography processes with the photomasks, are transferred to a substrate.

The cells may be provided with power supplies to perform the different functions. However, the power supplies may occupy areas that would otherwise be used for circuit with other functions. The research on and development for reducing the cell areas are ongoing.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A, 3B and 3C are schematic views of the backside, the front side and the cross section of a cell in accordance with some embodiments of the present disclosure.

FIGS. 4A, 4B and 4C are schematic views of the backside, the front side and the cross section of a cell in accordance with some embodiments of the present disclosure.

FIGS. 5A, 5B and 5C are schematic views of the backside, the front side and the cross section of a cell in accordance with some embodiments of the present disclosure.

FIG. 8, comprising parts (a) and (b), schematically illustrate circuit elements that may be used in a semiconductor device in accordance with some embodiments of the present disclosure.

DETAILED DESCRIPTION OF THE DISCLOSURE

Figure 1A:
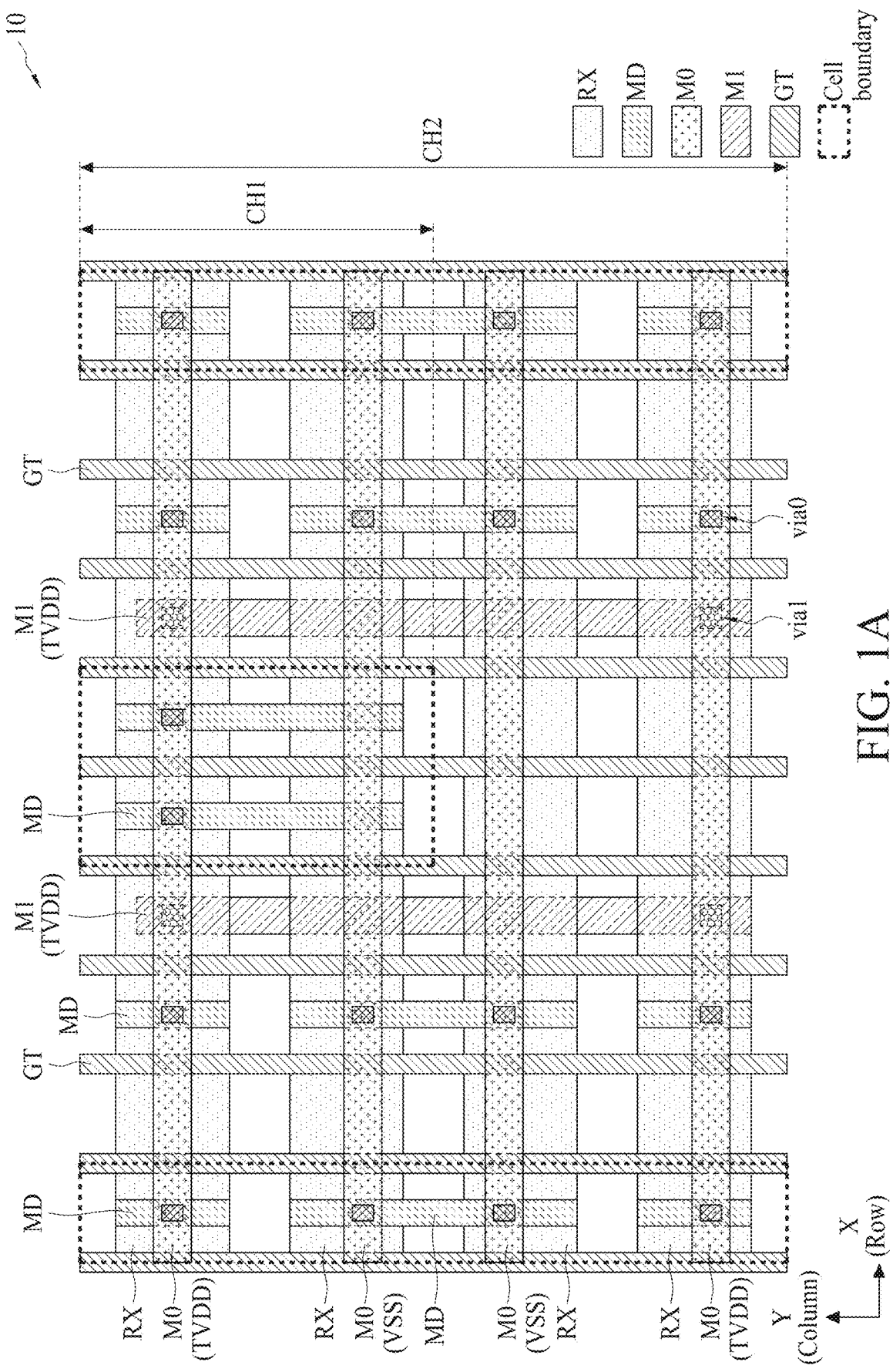
FIGS. 1A and 1B are schematic views of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that in the present disclosure, one pattern/layer/structure/surface/direction being substantially parallel to another pattern/layer/structure/surface/direction means that the two patterns/layers/structures/surfaces/directions are parallel to each other, or the two patterns/layers/structures/surfaces/directions are intended to be configured to be parallel to each other but may not be perfectly parallel to each other due to design, manufacturing, measurement errors/margins caused by unperfected manufacturing and measurement conditions. Such a description should be recognizable to one of ordinary skill in the art.

It should be understood that in the present disclosure, one pattern/layer/structure/surface/direction being substantially perpendicular to another pattern/layer/structure/surface/direction means that the two patterns/layers/structures/surfaces/directions are perpendicular to each other, or the two patterns/layers/structures/surfaces/directions are intended to be configured to be perpendicular to each other but may not be perfectly perpendicular to each other due to design, manufacturing, measurement errors/margins caused by unperfected manufacturing and measurement conditions. Such a description should be recognizable to one of ordinary skill in the art.

In the present disclosure, two layers/patterns/structures being formed on a same level means that the two layers/patterns/structures have a same distance from a reference plane, for example, a surface of a substrate, based on which a semiconductor device is formed, or the two layers/patterns/structures are intended to be configured to have a same distance from a reference plane, for example, a surface of a substrate, based on which a semiconductor device is formed but may not perfectly have the same distance from the reference plane due to design, manufacturing, measurement errors/margins caused by unperfected manufacturing and measurement conditions. Such a description should be recognizable to one of ordinary skill in the art.

In the present disclosure, two layers/patterns/structures being formed on different level means that with consideration of variations/errors caused by, for example, surface roughness, the two layers/patterns/structures have different distances from a reference plane, for example, a surface of a substrate, based on which a semiconductor device is formed.

In the present disclosure, a layer, a pattern, or a structure extending in one direction means that a dimension of the layer, the pattern, or the structure in the extended one direction is greater than another dimension of the layer, the pattern, or the structure in another dimension substantially perpendicular to the extended one direction.

In the present disclosure, a phrase "one of A, B and C" means "A, B and/or C" (A, B, C, A and B, A and C, B and C, or A, B and C), and does not mean one element from A, one element from B and one element from C, unless otherwise described.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

Further, it will be understood that when an element is referred to as being "connected to" or "coupled to" another element, it may be directly connected to or coupled to the other element, or intervening elements may be present.

Semiconductor devices can be manufactured on a substrate, usually but not necessarily made of silicon or other suitable semiconducting materials. Semiconductor devices can have circuit blocks that provide certain functionalities. These circuit blocks may be referred to as "cells." A semiconductor device may comprise a plurality of cells. The cells may be customarily designed or provided from (standard) cell libraries. The layout of a customarily designed cell may be drawn by the designer. The provider of (standard) cell libraries may provide the layout of their cells as well as other characteristics, such as timing performance and electrical parameters.

The substrate on which semiconductor devices are made may be one-sided or two-sided. For one-sided substrates, the terms "front side," "front-side" and "frontside" typically refer to the side on which circuit elements or devices (such passive devices and active devices) are present, whereas the terms "backside," "back-side" or "back side," usually without circuit elements, typically refer to the side opposite the front side.

For two-sided substrates, "front side" and similar terms still typically refer to the side on which circuit elements or devices are made, but there may also be circuit elements on the "backside." In the present disclosure, for two-sided substrates, the "front side" and similar terms typically refer to the side on which most of the active circuit elements (such as transistors and other circuit blocks formed by the transistors, such as logic gates and memory), whereas the "backside" usually has fewer, if any, active circuit elements.

Some cells may require power for proper functioning. On a substrate, power may be distributed by a network made of conductive materials, such as wires and vias. The power distribution network may be provided on the front side, the backside or both, of the substrate.

The power distribution network may supply a plurality of reference voltages of different polarities, such as positive, negative and ground. The power distribution network may comprise a plurality of voltage domains for the plurality of reference voltages. One or more conductive paths may be arranged between a cell and the power distribution network in order to provide the cell with one or more of the plurality of reference voltages. An example of such conductive paths is a power rail.

The voltage domains can provide the reference voltages by virtue of being connected to power supplies. Some of the voltage domains may be switchable, in the sense that the supplied reference voltage may be turned on and off depending circumstances, e.g., to reduce power consumption and/or leak currents. An example in the context of the present disclosure is VDD, which supplies a positive voltage of a certain magnitude in a switchable manner. A cell whose power is supplied by the VDD domain may be turned on or off depending on whether the supplying VDD is on or off. The switching ability may be provided by the VDD domain being connected to a real (perhaps external) power supply and via, e.g., power switches.

In contrast, some voltage domains may be "always on," meaning that the reference voltages thus provided stay in an on state. An example is the true VDD, which may be abbreviated as "TVDD," and supplies a reference voltage with the same polarity and magnitude as VDD. TVDD differs from VDD in that TVDD is always on, whereas VDD is switchable.

As mentioned above, the power distribution network may be provided on the backside in addition to the front side of the substrate. In some embodiments of the present disclosure, the substrate is sufficiently thin to allow a conductive path through the substrate to connect a power rail/domain on the backside to power circuit elements on the front side; one example of such conductive path is a backside via. One benefit of the backside power distribution network is the ability to reserve more areas on the front side of the substrate for circuit elements such as logic and memory.

In the context of the present disclosure, an "always-on cell" or "always on cell" refers to a cell connected to an always-on voltage domain; i.e., the power supply to such a cell does not get turned off. In an embodiment, an always-on cell may be connected to three voltage domains: VDD (of a positive polarity), TVDD (of a positive polarity) and VSS (a voltage of a negative polarity). In an embodiment, an always-on cell may be connected to VDD, TVDD and ground.

In the context of the present disclosure, a "gated cell" refers to a wide range of cells that are not always on. That is, a gated cell is not connected to an always-on voltage domain. In an embodiment, a gated cell is connected to two voltage domains: VDD and VSS.

Exemplary cells or blocks that are always on include control circuit, power management blocks and retention memory. The presence of an always-on power supply may provide benefits such as a more reliable circuit operation. However, introducing an always-on power supply into a cell might drawbacks, one of which is the area overhead of the always-on cell compared to a gated cell.

One reason for the area overhead of the always-on cell arises from the introduction of an always-on voltage domain (such as TVDD) in addition to other voltage domains such as VDD and VSS. Since the TVDD, VDD and VSS are different voltage domains, the conductive elements such as rails carrying these voltage domains are electrically separate from each other. That is, the conductive elements with different voltage domains need to satisfy some spatial requirements, which persons having ordinary skill in the art may refer to as "design rules," such as separation from each other of a sufficient distance. Hence, the more voltage domains are supplied to a cell, the more power rails are connected thereto, the larger the separation area among them is, and therefore the larger the cell becomes. Note that different design rules may employ for the front side and the backside of the substrate, depending on other design considerations. For example, the design rules for the backside may require a larger spacing than those for the front side because metal with bigger pitches are used on the backside. Other design considerations and parameters may also cause differences in the design rules between the two sides of the substrate.

The require distance between two conductive elements may be expressed in the unit of CPP, which stands for "compact poly pitch." For example, we may say that a line-end spacing of 2, 3, 4, 5, 6, 7, 8 or more CPPs between an elongated conductive element for TVDD and another elongated conductive element for VSS, where the two elongated conductive elements have similar shapes and are arranged substantially in parallel.

In an embodiment, the separation area and thus the total size of an always-on cell may be reduced by using a metal-layer cut. For example, if TVDD, VDD and VSS are supplied to a cell on the BM0 layer (backside metal layer 0), a BM0 cut may reduce the line-end spacing between the TVDD and the VSS. The BM0 may require an extra mask.

In accordance with some aspects of the present disclosure, an always-on cell may be designed such that the area overhead is reduced without resorting to a metal layer cut. This may be achieved by more efficient use of the separation area between circuit elements that provide an always-on voltage domain (or "pin" such domain "out") other circuit elements providing another voltage domain. The separation area, instead of left un-used, may be used by functional circuit elements other than providing power supplies to the always-on cell, such as logic cells and memory.

In accordance with some embodiments of the present disclosure, a semiconductor device on a two-sided substrate may be provided. Voltage domains such as TVDD, VDD and VSS may be distributed on the backside of the substrate to an always-on cell. The TVDD and VSS rails on the backside of the always-on cell are separated from each other by a certain distance in order to satisfy the design rules on the backside. Backside vias that penetrate the substrate may provide the TVDD and VSS voltage domains to the front side of the always-on cell. Further conductive elements on the front side may provide the TVDD and VSS voltage domains to other functional circuit elements on the front side. Such other functional circuit elements may exist in the separation between the conductive elements on the front side that provide the two voltage domains because the separation of said certain distance is required to satisfy the design rules on the backside but under some circumstances are not required by the design rules on the front side. Hence, the area between the conductive elements on the front side that provide the two voltage domains is utilized more efficiently.

To further increase the utilization efficiency of available area in an always-on cell, multiple functional circuit elements may be merged in to one always-on cell. In an embodiment, an always-on cell is referred to as a combined cell that comprises a cell that provides an always-on voltage domain, another cell that provides a negative voltage domain, and yet other cells that are merged in to the combined (always-on) cell provide various functionalities. For example, while one way to implement four one-bit buffers that need an always-on voltage is to create four cells each having its own one one-bit buffer and respective sets of voltage domains, another way to implement four one-bit buffers is to create a combined cell with one set of voltage domains and the four one-bit buffers merged into the combined cell. In other words, a multi-bit cell can be used to reduce area overhead of several one-bit cells. The merger can be done based on location and/or timing of the cells to be merged.

A location and/or timing analysis may indicate that cells of different types, areas and/or driving levels can be merged to reduce area overhead. In an embodiment, filler cells may be additionally introduced to the cells of different types, areas and/or driving levels to be merged to further reduce the area overhead.

More detailed embodiments of the present disclosure are described below with reference to the accompanied drawings. Note that the drawings are for illustration purposes and do not constitute, and cannot be construed as, limitations to the subject matter in the present disclosure.

Figure 1B:
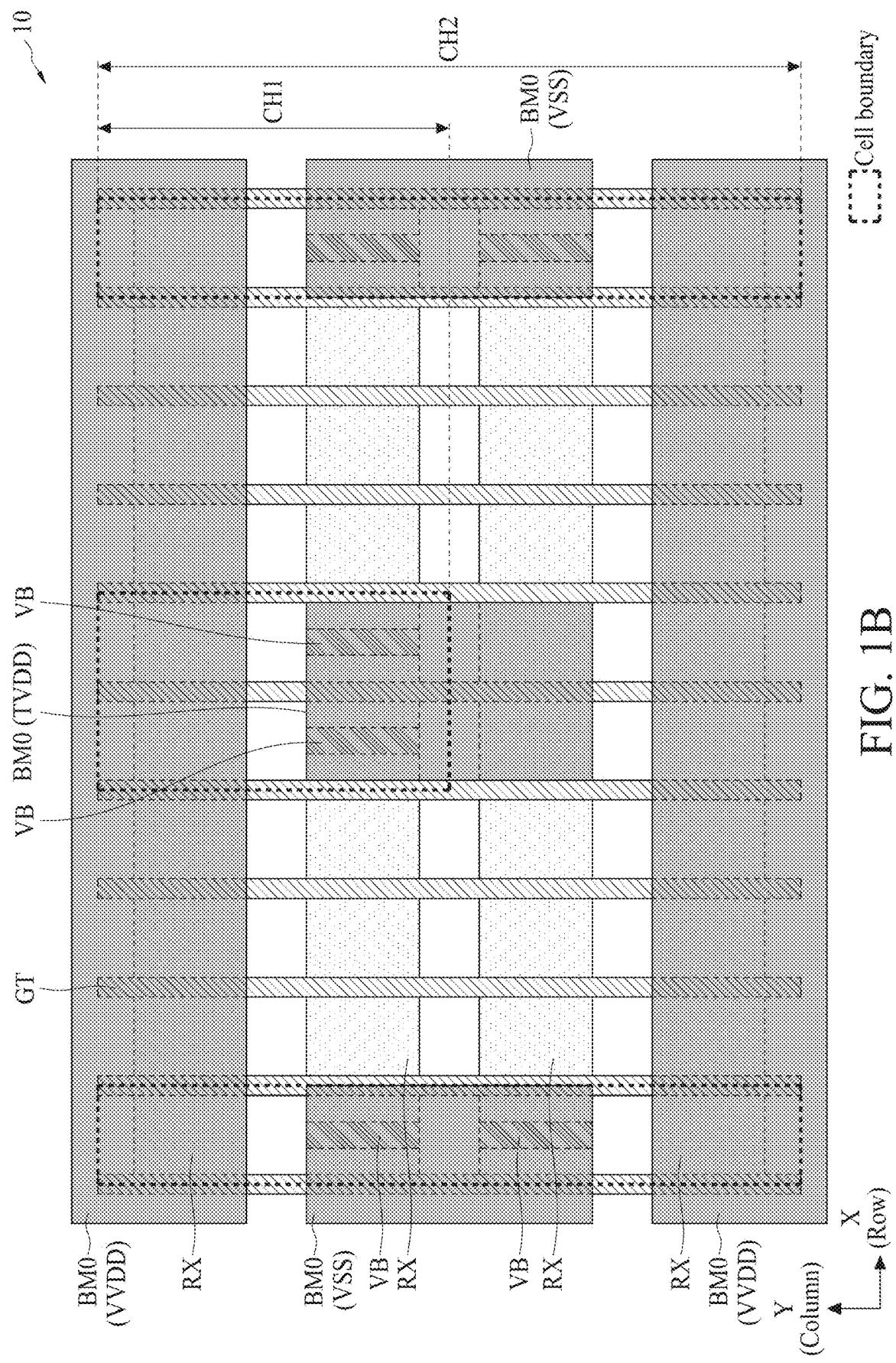

FIGS. 1A and 1B are schematic views of a semiconductor device 10 in accordance with some embodiments of the present disclosure. The semiconductor device 10 may be made on two sides of a substrate. In the illustrated embodiments, FIG. 1A illustrates a front side and, FIG. 1B illustrates a back side.

The semiconductor device 10 includes a plurality of cells. The boundary of some of the cells in FIG. 1A is indicated with dashed rectangles. In some embodiments, these cells may form one or more combined cells.

In FIG. 1A, the boundary of three cells is indicated: one in the middle of the semiconductor device 10, and two on opposing boundaries of the semiconductor device 10. All three cells are illustrated as extending in the column direction (Y-direction) with different lengths, referred to as "cell height." The width of the cells in the row direction (X-direction) may be referred to as "cell width." As illustrated in FIG. 1A, the cell in the middle has a cell height of CH1, and the two cells on the edge have a cell height of CH2. In FIG. 1A, the cell height CH2 is larger than the cell height CH1, although this is not a limitation. In some embodiments, the cell height CH2 is twice the cell height CH1.

The semiconductor device 10 may have several elements in different regions. The elements may include diffusion regions RX, gates GT, metal M0 (metal layer 0), metal M1 (metal layer 1), metal MD, vias via0 and vias via1. Some of the elements may form one cell. Conversely, one cell may include several elements. These elements may form circuits such as transistors, logic, memory and other circuits that can be manufactured. Note that the semiconductor device 10 may have other elements not illustrated in FIG. 1A.

The substrate on which the semiconductor device 10 is manufactured may be made of semiconducting materials such as silicon or germanium or appropriate alloys. The diffusion regions RX may be doped with impurities to alter the electrical characteristics of the substrate material. The diffusion regions RX may form, for example, the source/drain regions of a Field-Effect Transistor (FET). In the embodiment illustrated in FIG. 1A, the diffusion regions RX extend in the row direction, although this is not a limitation of the present disclosure.

The regions indicated by gate GT may be made of conductive materials such as polysilicon, although this is not a limitation. The gates GT, as its name suggests, may serve as the gate terminal of various types of transistors, such as FET. In the embodiment illustrated in FIG. 1A, the gates GT extend in the column direction, although this is not a limitation of the present disclosure.

The metal MD, metal M0 and metal M1 are electrically conductive and may be made of other types of conductive materials despite being named "metal." The metal MD may serve as local interconnects. In some embodiments, the metal MD is on a layer that is vertically different from the substrate surface and may serve to connect the doped regions to other elements of the semiconductor device 10, such as metal M0 and metal M1. In some embodiments, the metal MD may extend in the Z-direction; that is, the direction perpendicular to the row and column directions.

The metal M0 exists on a layer vertically separate from the substrate surface, e.g., above the substrate surface. Conductive, the metal M0 may distribute voltages at various levels. The metal M0 may include several electrically separate regions that, despite being on substantially the same layer, are used to distribute different levels of voltages. In the embodiment illustrated in FIG. 1A, the metal M0 includes two regions respectively distributing the voltage TVDD and the voltage VSS. It is also possible to say that the there are two voltage "domains" TVDD and VSS in the metal M0. In the embodiment illustrated in FIG. 1A, the metal M0 extends in the row direction, although this is not a limitation of the present disclosure. The metal M0 may be electrically connected to the metal MD by, for example, the vias indicated in FIG. 1A as via0.

The metal M1 exists on a layer vertically separate from the substrate surface and the metal M0, e.g., above the substrate surface and the metal M0. Conductive, the metal M1 may distribute voltages at various levels. The metal M1 may include several electrically separate regions that, despite being on substantially the same layer, are used to distribute different levels of voltages. In the embodiment illustrated in FIG. 1A, the metal M1 includes one region distributing the voltage TVDD. It is also possible to say that the there is a voltage "domains" TVDD in the metal M1. In the embodiment illustrated in FIG. 1A, the metal M1 extends in the column direction, although this is not a limitation of the present disclosure. The metal M1 may be electrically connected to the metal M0 by, for example, the vias indicated in FIG. 1A as via1.

As mentioned above, the semiconductor device 10 may have FET. The type of the FET is not limited. For example, planar FETs may be used in the semiconductor device 10, as well as FinFETs and other types of FET such as Gate-All-Around FETs.

The substrate on which the semiconductor device 10 is made may have a thickness in a wide range. In some embodiments, the substrate may have a thickness between about 1 micrometer and about 5 micrometers, between about 5 micrometer and about 10 micrometers, between about 10 micrometer and about 20 micrometers, between about 20 micrometer and about 50 micrometers, between about 50 micrometer and about 100 micrometers, between about 100 micrometer and about 200 micrometers, between about 200 micrometer and about 500 micrometers, in some unions of the aforementioned ranges, or in other appropriate ranges. Depending on the thickness of the substrate, some or all of the diffusion regions RX may be seen from both sides of the substrate. Depending on the thickness of the substrate (such as between about 0.1 micrometer and about 5 micrometers, or between about 0.2 micrometer and about 3 micrometers, or between about 0.2 micrometer and about 2 micrometers, or between about 0.2 micrometer and about 1 micrometer, between about 0.5 micrometer and about 1 micrometer, and other appropriate ranges of thickness), vias made of conductive materials may be made within the substrate to electrically connect some or all of the diffusion regions RX on the front side to other circuit elements on the backside.

FIG. 1B illustrates the back side of the substrate on which the semiconductor device 10 is manufactured. The semiconductor device 10 may include several cells with location corresponding to the cells already indicated in FIG. 1A and boundary indicated by the dashed rectangle. On the backside, different elements may exist.

The diffusion regions RX that can normally be seen from the front side may also be seen from the back side, depending on the thickness of the substrate; hence, the diffusion regions RX are illustrated in FIG. 1B. In some embodiments, the diffusion regions RX cannot be seen from the backside in the sense that the doping level near the backside surface is different from that near the front-side surface and may be closer to that of the un-doped parts of the substrate; in this case, the regions RX are marked in the schematic illustration of the backside merely to indicate the mirrored location on the backside of the diffusion regions RX made on the front-side.

In the embodiment illustrated in FIG. 1B, the gate materials are normally not made on the backside. Hence, the gate areas GT' in FIG. 1B indicate that gates GT exist in the mirrored location on the front side (see FIG. 1A) but does not necessarily mean that actual gate materials (such as polysilicon) exist on the backside.

The metal BM0 may exist on the backside of the semiconductor device 10. The metal BM0 exists on a layer vertically separate from the backside surface of the substrate, e.g., below the backside surface. Conductive, the metal BM0 may distribute voltages at various levels. The metal BM0 may include several electrically separate regions that, despite being on substantially the same layer, are used to distribute different levels of voltages.

In the embodiment illustrated in FIG. 1B, the metal BM0 includes three regions respectively distributing the voltage TVDD, the voltage VVDD and the voltage VSS. It is also possible to say that the there are three voltage "domains" TVDD, VVDD and VSS in the metal BM0. In the embodiment illustrated in FIG. 1B, the metal BM0 contain regions extending in both the row and column directions. In the embodiment illustrated in FIG. 1B, the region carrying the voltage TVDD (in the middle) and the two regions carrying the voltage VSS (on the left the right sides) extend in the column direction. The two regions carrying the voltage VVDD (on the top and bottom sides) extend in the row direction.

The backside vias VB may also exist on the backside of the semiconductor device 10, as illustrated in FIG. 1B. The backside vias VB are made of conductive materials and may extend in the Z-direction. The backside vias VB electrically connect the BM0 layer to other layers, such as the backside surface. The backside vias VB may extend into the substrate to connect layers and elements on the backside to elements within the substrate, such as the diffusion regions RX. The backside vias VB may extend sufficiently long to reach the front-side surface.

In the embodiment illustrated in FIG. 1B, backside vias VB exist between the BM0 region that carries TVDD to the backside surface; these backside vias VB may help distribute the voltage TVDD to the elements on the front side. Similarly, backside vias VB exist between the BM0 regions that carries the voltage VSS to the backside surface; these backside vias VB may help distribute the voltage VSS to the elements on the front side. In the embodiment illustrated in FIG. 1B, there is no backside vias that connect the VVDD BM0 regions to the backside surface, although this is not a limitation to the present disclosure.

Figure 2A:
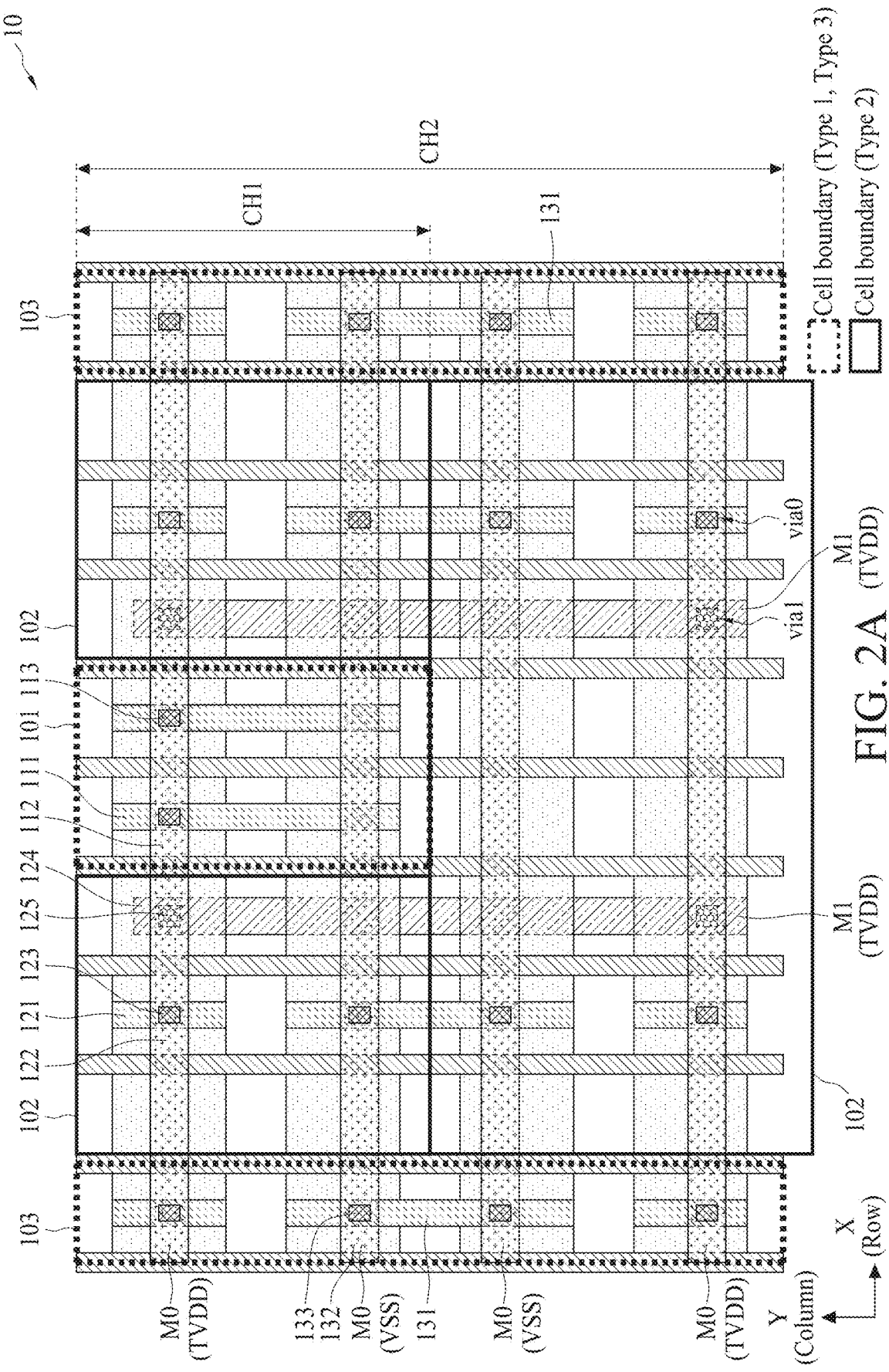
FIGS. 2A and 2B are schematic views of a semiconductor device in accordance with some embodiments of the present disclosure.
Figure 2B:
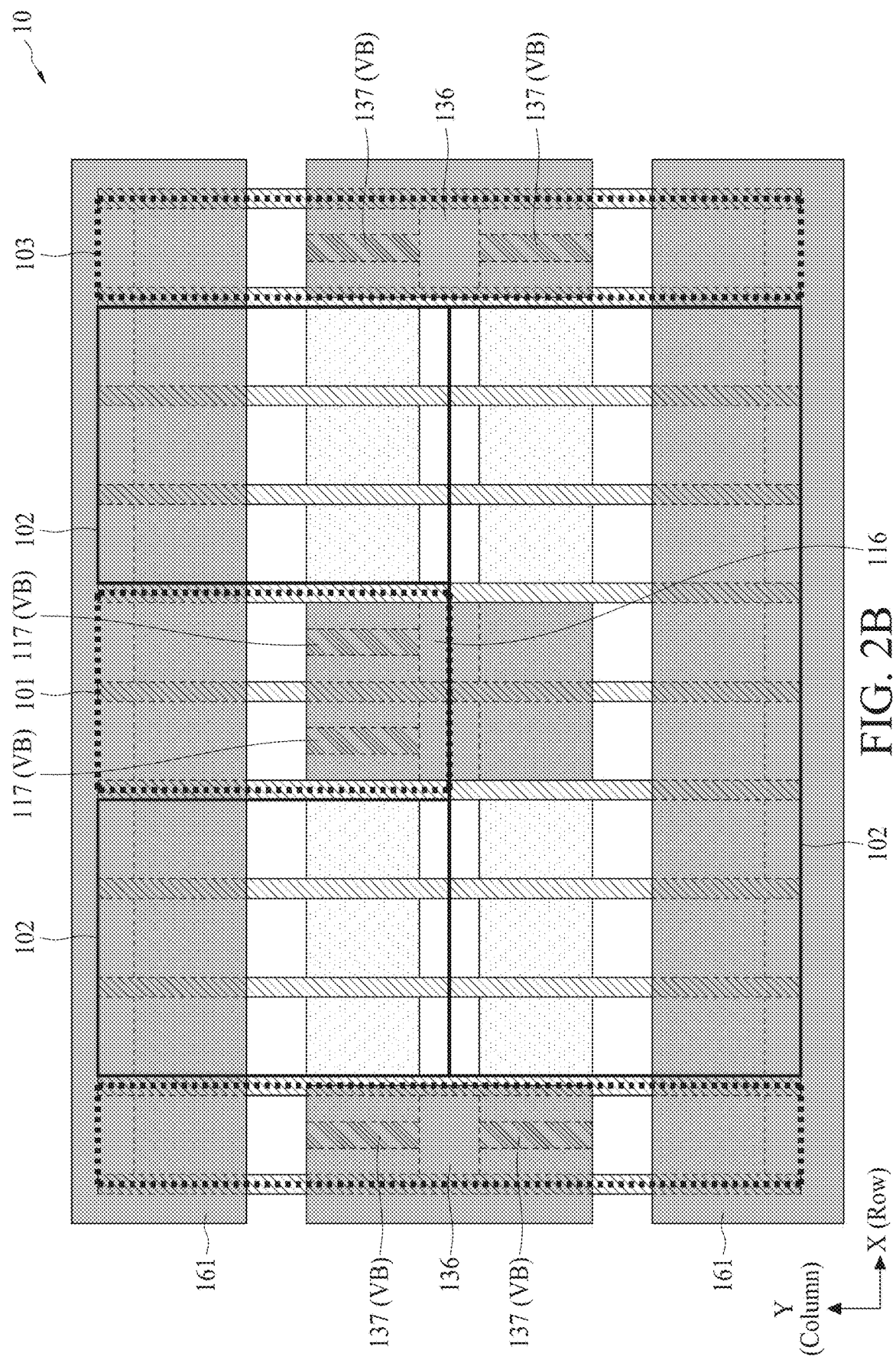

FIGS. 2A and 2B are schematic views of a semiconductor device 10 in accordance with some embodiments of the present disclosure. Compared to FIGS. 1A and 1B, FIGS. 2A and 2B contain more cell boundaries.

Refer to FIG. 2A, which illustrates the front side of the substrate on which the semiconductor device 10 is manufactured.

The semiconductor device 10 may include a cell 101 of the first group, a plurality of cells 102 of the second group, and a plurality of cells 103 of the third group. Each of the cells 101, 102, 103 may include several elements already explained with reference to FIG. 1A, such as the diffusion regions RX, the gates GT, the metal M0, M1, MD carrying different levels of voltage, and vias via0 and via1. The cells 101, 102, 103 of the first, second and third groups may be respectively referred to as type-1 cell 101, type-2 102 and type-3 cell 103. Note that the numbers illustrated in FIG. 1B that each types or groups of cells may have are merely exemplary and should not be construed as limitation to the present disclosure.

In addition to type-1 and type-3 cells 101, 103, three type-2 cells 102 are indicated in FIG. 1B: two type-2 cells 102 having the same cell height CH1 as the type-1 cell 101 are located between the type-1 cell 101 and each of the two type-3 cells 103, and another type-2 cell 102 having a cell width larger than the other two type-2 cells exist between the two type-3 cells 103 without an intervening type-1 cell 101.

The type-1 cell 101 may include diffusion regions RX, gate GT, metal 111, metal 112 and via 113. The metal 111 may be a portion of the metal MD. The metal 112 may be a portion of the metal M0. The via 113 may be an instance of the vias via0. The metal 111, metal 112 and via 113, electrically connected together, may distribute the voltage TVDD to other cells by way of, e.g., other portions of metal M0. The voltage TVDD may be always on.

The type-3 cell 103 may include diffusion regions RX, gate GT, metal 131, metal 132 and via 133. The metal 131 may be a portion of the metal MD. The metal 132 may be a portion of the metal M0. The via 133 may be an instance of the vias via0. The metal 131, metal 132 and via 133, electrically connected together, may distribute the voltage VSS to other cells by way of, e.g., other portions of metal M0. Other portions of the metal M0 and the metal MD may distribute another voltage, such as TVDD.

The type-2 cell 102 may include diffusion regions RX, gate GT, metal 121, metal 122, via 123, metal 124 and via 125. The metal 121 may be a portion of the metal MD. The metal 122 may be a portion of the metal M0. The via 123 may be an instance of the vias via0. The metal 124 may be a portion of the metal M1. The via 125 may be an instance of the vias via1. The metal 122, extending in the row direction, may receive the voltage TVDD from other cells such as the type-1 cell 101. The metal 124, extending in the column direction, of the type-2 cells 102 in the upper part may distribute the received voltage TVDD to other type-2 cells 102, such as those cells 102 in the lower part. Note that the metal M0 and the metal M1 are in vertically separate layers, so the fact that some portions of the metal M0 and the metal M1 seem to cross each other in FIG. 2A does not necessarily mean that these portions are electrically connected. For example, the portions of the metal M0 that carry TVDD and the portions of the metal M1 that carry TVDD are electrically connected by, e.g., the via 125. In contrast, the portions of the metal M0 that carry VSS and the portions of the metal M1 that carry TVDD are not electrically shorted to each other.

Refer to FIG. 2B, which illustrates the back side of the substrate on which the semiconductor device 10 is manufactured.

The type-1 cell 101 may include, in addition to the elements on the front side illustrated in FIG. 2A, metal 116 and vias 117. The metal 116 may be a portion of the metal BM0. The metal 116 may carry the voltage TVDD. The via 117 may be an instance of the backside vias VB. The metal 116 and vias 117, electrically connected together, may distribute the voltage TVDD to the other elements of the cell 101, such as the elements on the front side.

The type-3 cell 103 may include, in addition to the elements on the front side illustrated in FIG. 2A, metal 136 and vias 137. The metal 136 may be a portion of the metal BM0. The metal 136 may carry the voltage VSS. The via 137 may be an instance of the backside vias VB. The metal 136 and vias 137, electrically connected together, may distribute the voltage VSS to the other elements of the cells 103, such as the elements on the front side.

Metal 161 may also exist on the backside of the semiconductor device 10. The metal 161 may a portion of the metal BM0. The metal 161 may be electrically separate from the metal 116 of the type-1 cell 101 and the metal 136 of the type-3 cell 103. The metal 161 may carry the VVDD voltage, which may be switchable. In the embodiment illustrated in FIG. 2B, the metal 161 does not have vertically extending conductive elements connected thereto in the semiconductor device 10.

FIGS. 3A, 3B and 3C are schematic views of the backside, the front side and the cross section of a cell 301 in accordance with some embodiments of the present disclosure. The cell 301 may be a type-1 cell similar to the cell 101.

Refer to FIG. 3A. On the back side, the cell 301 may include metal 316 carrying the voltage TVDD and vias 317. Refer to FIG. 3B. On the front side, the cell 301 may include diffusion regions RX, gates GT, metal 311, metal 312 and vias 313. FIG. 3C illustrates the cross-sectional view of the dashed line in FIG. 3B, with the eye in FIG. 3B indicating the direction from which the cross-sectional view is observed.

From the cross-sectional view illustrated in FIG. 3C, a conductive path including the metal 316, the backside vias 317, conductive portions in the diffusion region RX, the metal 311 and the metal 312 in the cell 301 can distribute the voltage TVDD from the backside to the front side. That is, if the (external) power supply with the voltage TVDD is first connected to the backside of the substrate, such conductive path of the cell 301 may distribute the voltage TVDD from the backside to the front side.

The gate materials GT1 indicated as the nine small rectangles within the diffusion region RX indicate the gates implemented in Gate-All-Around (GAA) FETs. However, implementation of the cell 301 in other types of FET, such as planar FET and FinFET, is also possible.

The metal 361 in the VVDD domain may also exist in the cell 301, although there is no backside vias connecting the metal 361 to the front side.

FIGS. 4A, 4B and 4C are schematic views of the backside, the front side and the cross section of a cell 402 in accordance with some embodiments of the present disclosure. The cell 402 may be a type-2 cell similar to the cell 102.

Refer to FIG. 4A. On the back side, the cell 402 may include metal 402 carrying the voltage VVDD. Refer to FIG. 4B. On the front side, the cell 402 may include diffusion regions RX, gates GT, metal 421, metal 422, vias 423, metal 426 and metal 427. FIG. 4C illustrates the cross-sectional view of the dashed line in FIG. 4B, with the eye in FIG. 4B indicating the direction from which the cross-sectional view is observed.

The cross-sectional view illustrated in FIG. 4C indicates that there is no path that connects the VVDD domain (BM0) on the backside to the front side. Instead, the diffusion regions RX and the circuit devices (active and/or passive) that may from therein receive the power supplies TVDD and VSS from the other cells on the front side by way of the metal 422 and metal 426. These voltages are connected to the circuit devices by way of the metal 421.

FIGS. 5A, 5B and 5C are schematic views of the backside, the front side and the cross section of a cell 503 in accordance with some embodiments of the present disclosure. The cell 503 may be a type-3 cell similar to the cell 103.

Refer to FIG. 5A. On the back side, the cell 503 may include metal 536 carrying the voltage VSS and vias 537. Refer to FIG. 5B. On the front side, the cell 503 may include diffusion regions RX, gates GT, metal 531, metal 532 and vias 533. FIG. 5C illustrates the cross-sectional view of the dashed line in FIG. 5B, with the eye in FIG. 5B indicating the direction from which the cross-sectional view is observed.

From the cross-sectional view illustrated in FIG. 5C, a conductive path including the metal 536, the backside vias 537, conductive portions in the diffusion region RX, the metal 531 and the metal 532 in the cell 503 can distribute the voltage VSS from the backside to the front side. That is, if the (external) power supply with the voltage VSS is first connected to the backside of the substrate, such conductive path of the cell 503 may distribute the voltage TVDD from the backside to the front side.

Refer back to FIGS. 2A and 2B. With the explanation of FIGS. 3A-3C, FIGS. 4A-4C and FIGS. 5A-5C in mind, it is understandable that that the type-1 cell 101 may "pin out" the power supply TVDD from the backside and distribute it to the type-2 cells 102 via metal M0, M1 on the front side. Similarly, the type-1 cell 103 may "pin out" the power supply VSS from the backside and distribute it to the type-2 cells 102 via metal M0 on the front side.

One advantage of placing the type-1 cell 101 in the middle of a combined cell is shorter distribution paths for the voltage TVDD. Since the TVDD is positive and may have a significant magnitude, long distribution path may cause more resistive loss. The type-1 cell 101, by being placed in the middle of the semiconductor device 10 and surrounded (partially or entirely) by the type-2 cells 102 to which the type-1 cell 101 pins out and distributes the TVDD voltage, distribution path and resistive loss may be optimized.

Figure 6A:
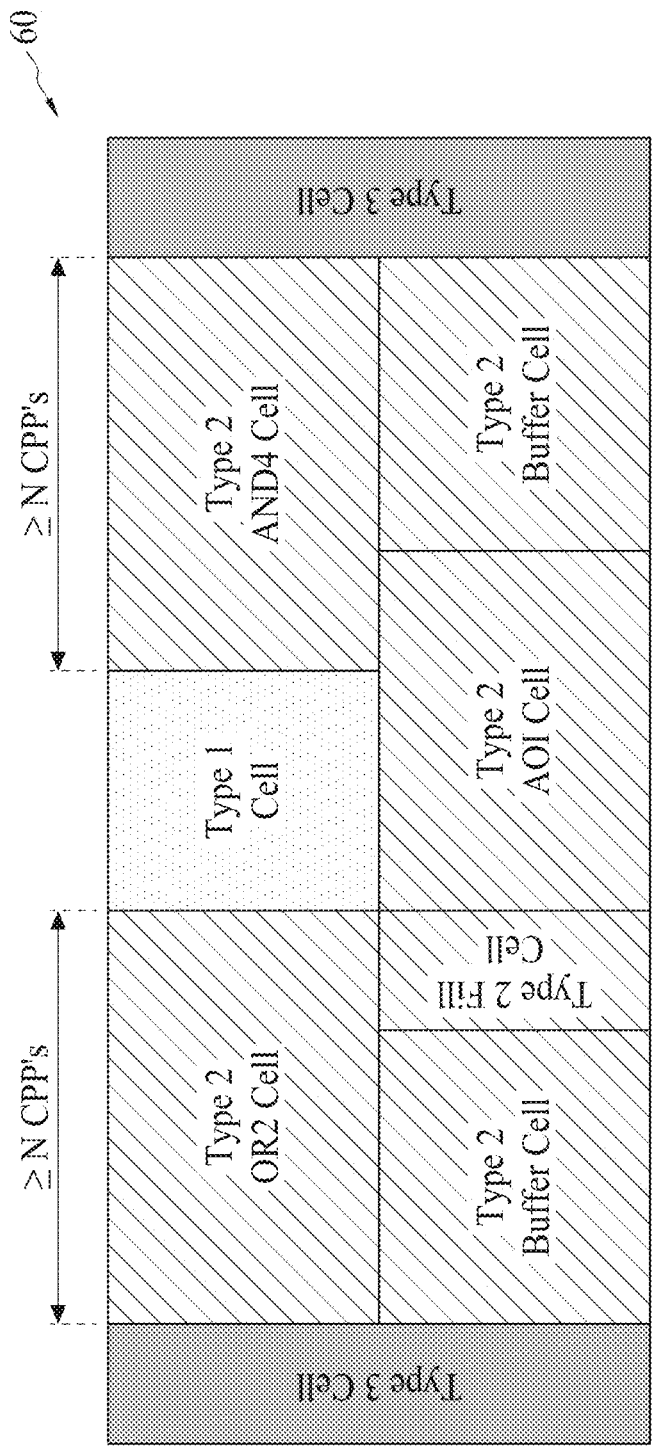
FIGS. 6A and 6B are schematic views of a semiconductor device in accordance with some embodiments of the present disclosure.
Figure 6B:
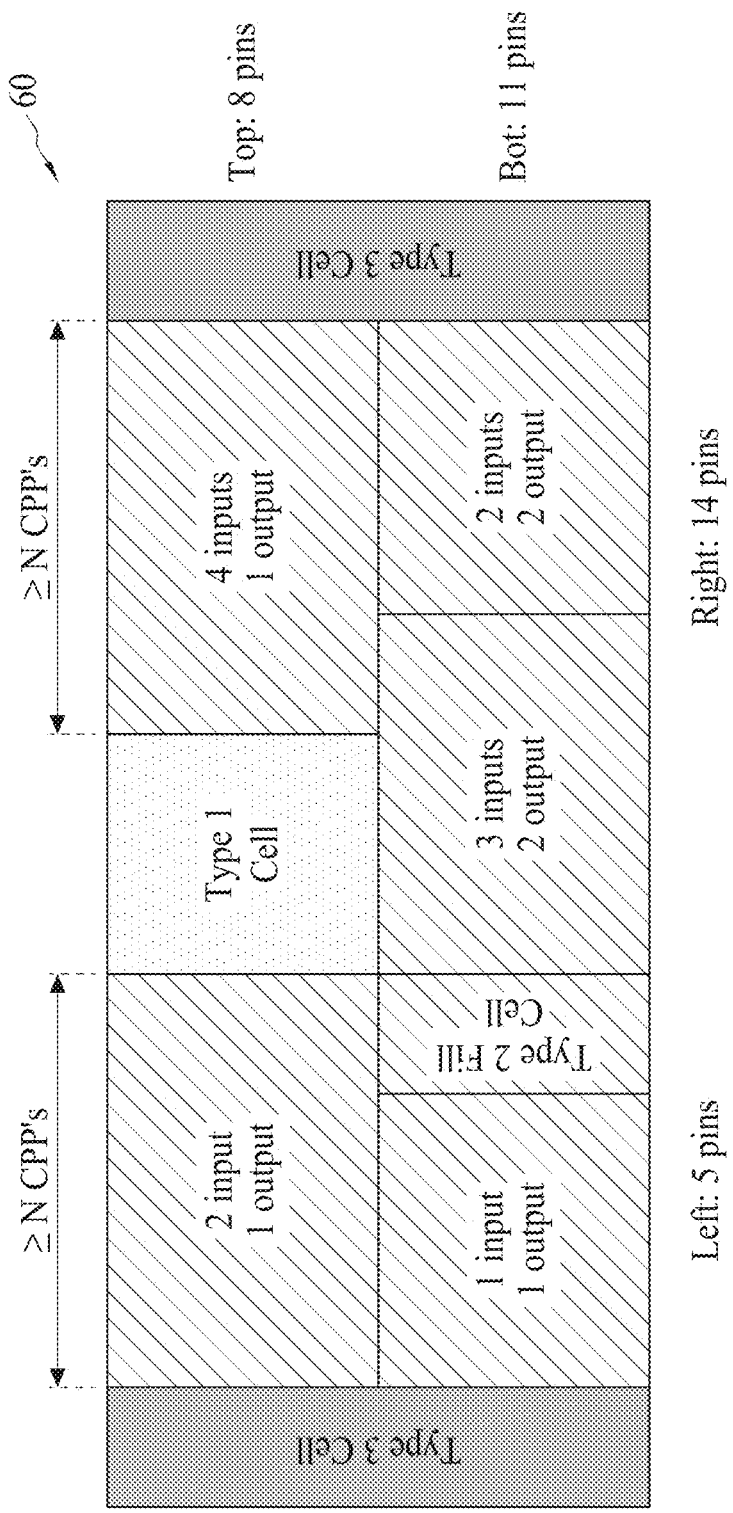

FIGS. 6A and 6B are schematic views of a semiconductor device 10 in accordance with some embodiments of the present disclosure.

Refer to FIG. 6A. The semiconductor device 60 includes various type-1, type-2 and type-3 cells. The type-1 cell may provide a first supply voltage, such as TVDD. The type-3 cells may provide a second supply voltage, such as VSS or ground. The type-2 cells may include various functional cells, such as buffer, logic (OR, AND, NOT, AOI, etc.) and memory. The type-2 cells may also include fill cells that may serve to fill in the spaces after the functional cells have been placed and routed.

FIG. 6A indicates that the type-1 and type-3 cells are separated in the row direction a distance of at least N CPP, where N may be an appropriate integer. In an embodiment, the distance between a type-1 cell and a type-3 cell is 3 CPP. The N may be determined in order to satisfy design rules on the backside. The design rules on the backside may be relevant here because type-1 and type-3 cells have metal portions on the backside that require a N CPP spacing between them. Examples are the metal 116 for the type-1 cell and the metal 136 for the type-3 cells.

In the embodiment of FIG. 6A, the backside of the type-1 and type-3 cells respectively comprise elements carrying the TVDD and VSS voltages. Carrying different voltages, which may be of opposite polarities, these elements cannot be shorted and hence the design rules may impose a certain minimum distance between them. The spaces between the type-1 and type-3 cells on the front side, however, can be occupied by functional cells, thereby leading to a more efficient use of the area on the front side.

FIG. 6B indicates that each of the functional type-2 cells (except fill cells) may have I/O pins. Once the placement of the type-1 and type-3 cells is determined, there can still be many possible placement solutions for the given set of functional type-2 cells. In one embodiment, the placement solution that leads to the least pin density imbalance is selected. A lower pin density may be desirable because of reduced chances of interferences (e.g., cross-talk) among the pins.

The pin density imbalance may be viewed in at least two ways: top-down pin density imbalance and left-right pin density imbalance. In the embodiment of FIG. 6B, the top-down boundary is the lower edge of the type-1 cell. In the embodiment of FIG. 6B, the left-right boundary is the left edge of the type-1 cell in the middle (although the right edge of the type-1 cell is also a possible definition of the left-right boundary). The top-down pin density imbalance can be determined by first counting the pin numbers in the top part and the bottom part and then determining a figure of merit based on the relative pin numbers in the top and bottom parts. In an embodiment, the top-down pin density imbalance is the ratio of the top pin count to the bottom pin count, e.g., 8/11 in the embodiment of FIG. 6B. The left-right pin density imbalance may be determined in a similar way. It is acceptable to have more than one definition for the figure of merit based on the relative pin numbers, as long as the same definition is used consistently to compare the pin densities of the different placement solutions.

Another possible figure of merit is the amount of difference between two pin counts. For example, two pin counts may differ from each other by 10%, 20%, 30%, 40%, 50%, 75%, 100%, 150%, 200%, 300%, 400%, 500% or more. It may be chosen that two pin counts are "balanced" if they differ from each other by, say, 10%, 20%, 30%, 40%, 50%, 75%, 100%, 150%, 200%, 300% or less. It may be chosen that two pin counts are "not balanced" (and hence another placement solution will be evaluated with its pins counted) if they differ from each other by, say, 10%, 20%, 30%, 40%, 50%, 75%, 100%, 150%, 200%, 300%, 400%, 500% or more.

Figure 7:
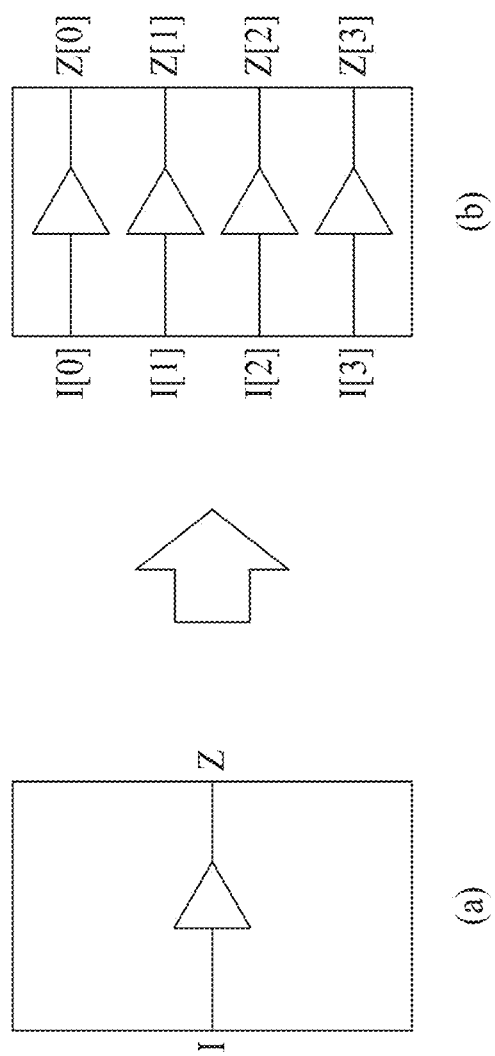
FIG. 7, comprising parts (a) and (b), schematically illustrate circuit elements that may be used in a semiconductor device in accordance with some embodiments of the present disclosure.

FIG. 7, comprising parts (a) and (b), schematically illustrate cells that may be used in a semiconductor device in accordance with some embodiments of the present disclosure.

FIG. 7(a) illustrates a one-bit buffer. Suppose four-bit of information is to be stored in a semiconductor device. One way to achieve this function is to design four cells each having a one-bit buffer and its own elements for power supply. This would amount to replicating the one-bit buffer of FIG. 7(a) four times.

FIG. 7(b) illustrates a four-bit buffer, which may be a more advantageous solution compared to four one-bit buffers of FIG. 7(a), because all four buffers in the cell of FIG. 7(b) share the same power supply elements. This leads to a more efficient use of the silicon real estate, i.e., a more efficient use of available area on the substrate. The four-bit buffer of FIG. 7(b) may be merged from four one-bit buffers.

FIG. 8, comprising parts (a) and (b), schematically illustrate cells that may be used in a semiconductor device in accordance with some embodiments of the present disclosure.

FIG. 8(a) illustrates three groups of circuit elements, each group having a node connected to four one-bit buffers, thereby providing four-bit information storage capacity to the node. As explained above, some of the one-bit buffers may be merged into a multi-bit cell to increase area efficiency.

The merger candidates may be chosen based on timing and/or location. In the examples shown in FIGS. 8(a) and 8(b), the one-bit buffers that are closed to each other may be merged into a multi-bit cell.

Figure 9:
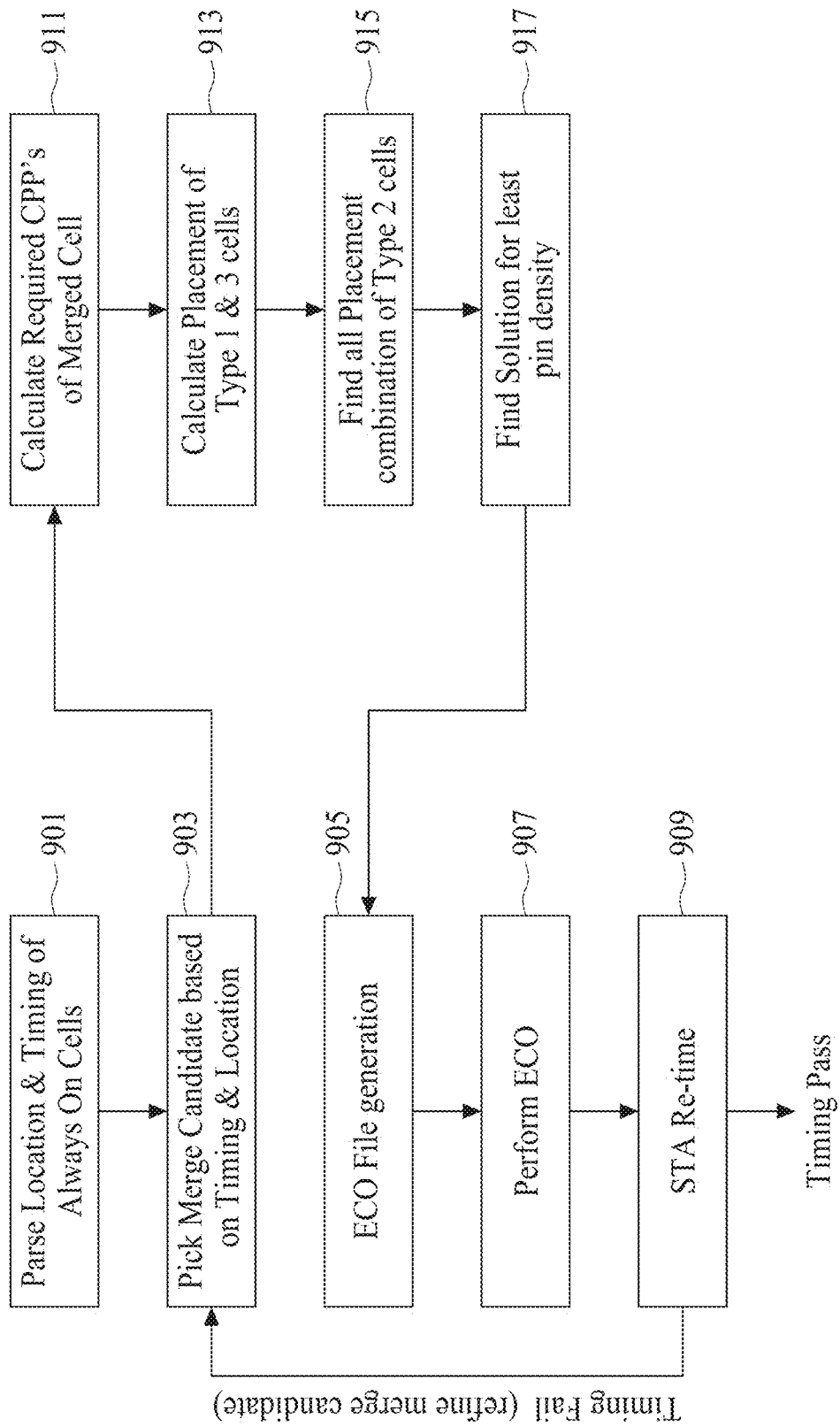
FIG. 9 is an exemplary flowchart for a method of designing a semiconductor device in accordance with some embodiments of the present disclosure.

FIG. 9 is an exemplary flowchart for a method of designing a semiconductor device in accordance with some embodiments of the present disclosure. The semiconductor device may include an always-on cell.

At step 901, the location and/or timing of always-on cells are parsed or analyzed. This helps indicate which (functional) cells to merge that will share the same power supply elements.

At step 903, the merger candidates are selected based on timing and/or location requirements, after which the placement of the selected cells to be merged is determined.

Refer to step 911. The required CPP's of merged cell to satisfy relevant design rules are calculated. Afterwards, at step 913, the placement of type-1 and type-3 cells are determined. In some embodiments, the type-1 cell is placed in the middle of the merged to optimize voltage distribution efficiency and minimize resistive loss.

Refer to step 915. All placement combinations of the type-2 cells to be merged are found. This can be done manually, although using software is more common. Afterwards, at step 917, the placement solution with the least pin density is selected.

At step 905, an Engineering Change Order (ECO) file is generated. At step 907, the ECO is performed. At step 909, STA re-timing is performed. The design will end if the timing analysis passes; otherwise, we go back to step 903 and re-evaluate the merger candidates.

Figure 10:
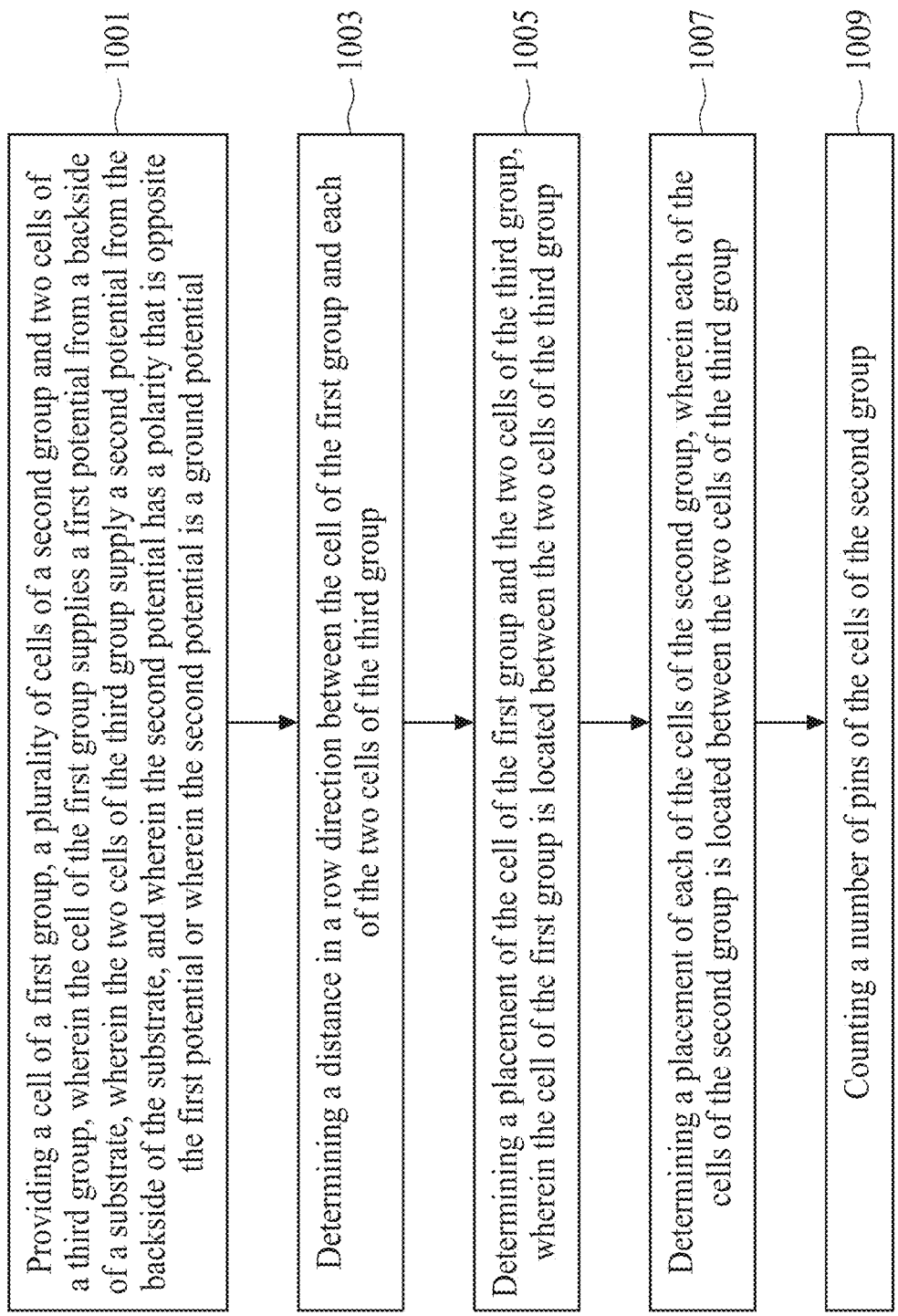
FIG. 10 is an exemplary method in accordance with some embodiments of the present disclosure.

FIG. 10 is an exemplary method in accordance with some embodiments of the present disclosure. The method may be used to design or make a semiconductor device.

At step 1001, a cell of a first group, a plurality of cells of a second group and two cells of a third group may be provided. The cell of the first group supplies a first potential from a backside of a substrate. The two cells of the third group may supply a second potential from the backside of the substrate. The second potential may have a polarity that is opposite the first potential. Alternatively, the second potential may be a ground potential.

At step 1003, a distance in a row direction between the cell of the first group and each of the two cells of the third group may be determined.

At step 1005, a placement of the cell of the first group and the two cells of the third group may be determined. The cell of the first group may be located between the two cells of the third group.

At step 1007, a placement of each of the cells of the second group may be determined. Each of the cells of the second group may be located between the two cells of the third group.

At step 1009, a number of pins of the cells of the second group may be counted. Additionally and optionally, the pin density imbalance may be determined.

In the forgoing embodiments, relatively simple logic gates, such as an AND gate, an OR gate, an XOR gate, a NOT gate (invertor), a NAND gate, a NOR gate, and/or an XNOR gate are realized by the smallest height standard cells, and a combinational logic circuit such as a multiplexer, an AND-OR-Invert (AOI) logic and/or an OR-AND-Invert (OAI) logic are realized by the standard cells having cell heights higher than those for simple logic gates.

In the present disclosure, a semiconductor device is disclosed. The semiconductor device includes an always-on cell with improved area efficiency. The functional cells in the always-on cell are placed between a plurality of types of power-supply cells, thereby improving the area efficiency of the combined always-on cell.

It will be understood that not all advantages have been necessarily discussed herein, no particular advantage is required for all embodiments or examples, and other embodiments or examples may offer different advantages.

According to an aspect of the present disclosure, a semiconductor device is provided. The semiconductor device comprises: a plurality of cells, the plurality of cells comprising a cell of a first group, a plurality of cells of a second group and two cells of a third group, wherein the cell of the first group comprises a first power supply wiring for supplying a first potential, wherein at least one of the two cells of the third group comprises a second power supply wiring for supplying a second potential, and wherein the second potential has a polarity that is opposite the first potential or wherein the second potential is a ground potential; a third power supply wiring on a backside of a substrate that supplies the first potential, wherein the first power supply wiring comprises a via coupled to the third power supply wiring; wherein the cell of the first group is located between the two cells of the third group and separated from each of the two cells of the third group in a row direction by a distance; wherein the cell of the first group supplies the first potential to the cells of the second group via a wiring on a front-side of the substrate, wherein the front-side is opposite the backside.

In some embodiments, the first potential may be always on. In some embodiments, the first potential may be TVDD. In some embodiments, the second potential may be VSS.

In some embodiments, the cells of the second group may comprise functional cells. In some embodiments, some or each of the cells of the second group may be selected from a group consisting of a logic gate, a fill cell, a buffer, an adder, a multiplexer, a flip-flop and a counter.

According to an aspect of the present disclosure, a method is provided. The method includes: providing a cell of a first group, a plurality of cells of a second group and two cells of a third group, wherein the cell of the first group supplies a first potential from a backside of a substrate, wherein the two cells of the third group supply a second potential from the backside of the substrate, and wherein the second potential has a polarity that is opposite the first potential or wherein the second potential is a ground potential; determining a distance in a row direction between the cell of the first group and each of the two cells of the third group; determining a placement of the cell of the first group and the two cells of the third group, wherein the cell of the first group is located between the two cells of the third group; determining a placement of each of the cells of the second group, wherein each of the cells of the second group is located between the two cells of the third group; and counting a number of pins of the cells of the second group.

According to an aspect of the present disclosure, a method is provided. The method includes: providing a cell of a first group, a plurality of cells of a second group and two cells of a third group, wherein the cell of the first group supplies a first potential from a backside of a substrate, wherein the two cells of the third group supply a second potential from the backside of the substrate, and wherein the second potential has a polarity that is opposite the first potential or wherein the second potential is a ground potential; determining a distance in a row direction between the cell of the first group and each of the two cells of the third group; determining a placement of the cell of the first group and the two cells of the third group, wherein the cell of the first group is located between the two cells of the third group; determining a placement of each of the cells of the second group, wherein each of the cells of the second group is located between the two cells of the third group; and counting a number of pins of the cells of the second group, wherein the number of pins of at least one of the cell of the second group is zero.

According to an aspect of the present disclosure, a method is provided. The method includes: providing a cell of a first group, a plurality of cells of a second group and two cells of a third group, wherein the cell of the first group supplies a first potential from a backside of a substrate; determining a distance in a row direction between the cell of the first group and each of the two cells of the third group; determining a placement of the cell of the first group and the two cells of the third group, wherein the cell of the first group is located between the two cells of the third group; determining a placement of each of the cells of the second group, wherein each of the cells of the second group is located between the two cells of the third group; and counting a number of pins of the cells of the second group.

In some embodiments, counting a number of pins of the cells of the second group may further comprise determining a first pin count for the cells of the second group that are between the cell of the first group and one of the two cells of the third group; and determining a second pin count for the cells of the second group that are between the cell of the first group and the other of the two cells of the third group. In some embodiments, the method may further comprise determining the placement of each of the cells of the second group if the first pin count differs from the second pin count by 10%, 20%, 30%, 40%, 50%, 75%, 100%, 150%, 200%, 300%, 400%, 500% or more. In some embodiments, the steps of determining a placement of each of the cells of the second group, counting a number of pins of the cells of the second group, determining a first pin count and determining a second pin count may be iteratively performed until the first pin density differs from the second pin density by 10%, 20%, 30%, 40%, 50%, 75%, 100%, 150%, 200%, 300%, 400%, 500% or less.

In some embodiments, counting a number of pins of the cells of the second group may comprise determining a third pin count for the cells of the second group that are between the cell of the first group and one of the two cells of the third group in a row direction and between the cell of the first group and the other of the two cells of the third group in the row direction; and determining a fourth pin count for the cells of the second group that are between the two cells of the third group without the cell of the first group intervening. In some embodiments, the method may further comprise determining the placement of each of the cells of the second group if the third pin count differs from the fourth pin count by 10%, 20%, 30%, 40%, 50%, 75%, 100%, 150%, 200%, 300%, 400%, 500% or more. In some embodiments, the steps of determining a placement of each of the cells of the second group, counting a number of pins of the cells of the second group, determining a third pin count and determining a fourth pin count may be iteratively performed until the third pin density differs from the fourth pin density by 10%, 20%, 30%, 40%, 50%, 75%, 100%, 150%, 200%, 300%, 400%, 500% or less.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
providing a cell of a first group, a plurality of cells of a second group and two cells of a third group, wherein the cell of the first group supplies a first potential from a backside of a substrate, wherein the two cells of the third group supply a second potential from the backside of the substrate, and wherein the second potential has a polarity that is opposite the first potential or wherein the second potential is a ground potential;
determining a distance in a row direction between the cell of the first group and each of the two cells of the third group;
determining a placement of the cell of the first group and the two cells of the third group, wherein the cell of the first group is located between the two cells of the third group;
determining a placement of each of the cells of the second group, wherein each of the cells of the second group is located between the two cells of the third group; and
counting a number of pins of the cells of the second group.

2. The method of claim 1, wherein counting a number of pins of the cells of the second group further comprises:
determining a first pin count for the cells of the second group that are between the cell of the first group and one of the two cells of the third group.

3. The method of claim 2, wherein counting a number of pins of the cells of the second group further comprises:

determining a second pin count for the cells of the second group that are between the cell of the first group and the other of the two cells of the third group.

4. The method of claim 3, further comprising:
determining the placement of each of the cells of the second group if the first pin count differs from the second pin count by 50% or more.

5. The method of claim 4, wherein determining a placement of each of the cells of the second group, counting a number of pins of the cells of the second group, determining a first pin count and determining a second pin count are iteratively performed until the first pin density differs from the second pin density by 50% or less.

6. The method of claim 1, wherein counting a number of pins of the cells of the second group further comprises:
determining a third pin count for the cells of the second group that are between the cell of the first group and one of the two cells of the third group in a row direction and between the cell of the first group and the other of the two cells of the third group in the row direction.

7. The method of claim 6, wherein counting a number of pins of the cells of the second group further comprises:
determining a fourth pin count for the cells of the second group that are between the two cells of the third group without the cell of the first group intervening.

8. The method of claim 7, further comprising:
determining the placement of each of the cells of the second group if the third pin count differs from the fourth pin count by 50% or more.

9. The method of claim 8, wherein determining a placement of each of the cells of the second group, counting a number of pins of the cells of the second group, determining a third pin count and determining a fourth pin count are iteratively performed until the third pin density differs from the fourth pin density by 50% or less.

10. The method of claim 1, wherein the plurality of cells of the second group are provided based on timing, location, or both of the cells of the second group.

11. The method of claim 1, wherein the determining a placement of each of the cells of the second group comprises determining all possible placement combinations for the cells of the second group.

12. The method of claim 11, wherein the method further comprises:
determining a top-down pin density imbalance or a left-right pin density imbalance or both for each of the possible placement combinations.

13. A method, comprising:
providing a cell of a first group, a plurality of cells of a second group and two cells of a third group, wherein the cell of the first group supplies a first potential from a backside of a substrate, wherein the two cells of the third group supply a second potential from the backside of the substrate, and wherein the second potential has a polarity that is opposite the first potential or wherein the second potential is a ground potential;
determining a distance in a row direction between the cell of the first group and each of the two cells of the third group;
determining a placement of the cell of the first group and the two cells of the third group, wherein the cell of the first group is located between the two cells of the third group;
determining a placement of each of the cells of the second group, wherein each of the cells of the second group is located between the two cells of the third group; and
counting a number of pins of the cells of the second group, wherein the number of pins of at least one of the cell of the second group is zero.

14. The method of claim 13, wherein counting a number of pins of the cells of the second group further comprises:
determining a first pin count for the cells of the second group that are between the cell of the first group and one of the two cells of the third group.

15. The method of claim 14, wherein counting a number of pins of the cells of the second group further comprises:
determining a second pin count for the cells of the second group that are between the cell of the first group and the other of the two cells of the third group.

16. The method of claim 13, wherein the plurality of cells of the second group are provided based on timing, location, or both of the cells of the second group.

17. A method, comprising:
providing a cell of a first group, a plurality of cells of a second group and two cells of a third group, wherein the cell of the first group supplies a first potential from a backside of a substrate;
determining a distance in a row direction between the cell of the first group and each of the two cells of the third group;
determining a placement of the cell of the first group and the two cells of the third group, wherein the cell of the first group is located between the two cells of the third group;
determining a placement of each of the cells of the second group, wherein each of the cells of the second group is located between the two cells of the third group; and
counting a number of pins of the cells of the second group.

18. The method of claim 17, wherein the two cells of the third group supply a second potential from the backside of the substrate.

19. The method of claim 17, wherein determining a placement of each of the cells of the second group comprises determining all possible placement combinations for the cells of the second group.

20. The method of claim 19, wherein the method further comprises:
determining a top-down pin density imbalance or a left-right pin density imbalance or both for each of the possible placement combinations.

* * * * *